United States Patent
Sogard

(10) Patent No.: US 7,580,112 B2
(45) Date of Patent: Aug. 25, 2009

(54) CONTAINMENT SYSTEM FOR IMMERSION FLUID IN AN IMMERSION LITHOGRAPHY APPARATUS

(75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 444 days.

(21) Appl. No.: 11/450,381

(22) Filed: Jun. 12, 2006

(65) Prior Publication Data

US 2007/0046916 A1 Mar. 1, 2007

Related U.S. Application Data

(60) Provisional application No. 60/710,895, filed on Aug. 25, 2005.

(51) Int. Cl.
*G03B 27/42* (2006.01)

(52) U.S. Cl. .............................. 355/53; 355/30; 355/77

(58) Field of Classification Search .................. 355/30, 355/53, 77
See application file for complete search history.

(56) References Cited

U.S. PATENT DOCUMENTS

| | | | | |
|---|---|---|---|---|
| 3,648,587 | A | * | 3/1972 | Stevens ....................... 355/44 |
| 4,346,164 | A | * | 8/1982 | Tabarelli et al. ............. 430/311 |
| 4,480,910 | A | * | 11/1984 | Takanashi et al. ............. 355/30 |
| 5,528,118 | A | | 6/1996 | Lee |
| 5,668,672 | A | | 9/1997 | Oomura |
| 5,689,377 | A | | 11/1997 | Takahashi |
| 5,835,275 | A | | 11/1998 | Takahashi et al. |
| 5,874,820 | A | | 2/1999 | Lee |
| 6,788,477 | B2 | * | 9/2004 | Lin ........................... 359/820 |
| 6,952,253 | B2 | | 10/2005 | Lof et al. |
| 7,365,828 | B2 | * | 4/2008 | Takamura ..................... 355/53 |
| 2004/0165159 | A1 | | 8/2004 | Lof et al. |
| 2004/0263809 | A1 | | 12/2004 | Nakano |
| 2005/0007569 | A1 | | 1/2005 | Streefkerk et al. |
| 2005/0036121 | A1 | * | 2/2005 | Hoogendam et al. .......... 355/30 |
| 2006/0028632 | A1 | | 2/2006 | Hazelton et al. |

FOREIGN PATENT DOCUMENTS

| | | | |
|---|---|---|---|
| EP | 1420299 A2 | * | 5/2004 |
| WO | WO 2004/055803 A1 | | 7/2004 |
| WO | WO 2004/093159 A2 | | 10/2004 |
| WO | WO 2005/024517 A2 | | 3/2005 |

* cited by examiner

*Primary Examiner*—Diane I Lee
*Assistant Examiner*—Steven H Whitesell-Gordon
(74) *Attorney, Agent, or Firm*—Oliff & Berridge, PLC

(57) ABSTRACT

A containment system contains an immersion fluid in an immersion area to fill a gap between a projection system and an object to be exposed with the immersion fluid. The containment system includes an immersion fluid barrier formed by a pressurized gas that is supplied to a location adjacent to the immersion area. A supply of the pressurized gas to the immersion fluid barrier is intermittently stopped during an exposure operation of the object.

43 Claims, 11 Drawing Sheets

CONTAINMENT SYSTEM FOR IMMERSION FLUID IN AN IMMERSION LITHOGRAPHY APPARATUS

RELATED APPLICATION

This application claims the benefit of U.S. Provisional Patent Application No. 60/710,895 filed Aug. 25, 2005, the disclosure of which is incorporated herein by reference in its entirety.

BACKGROUND

The invention relates generally to immersion lithography apparatus and methods, and particularly to systems and methods for containing immersion fluid within a gap between a projection system and an object to be exposed by the projection system.

Lithography exposure apparatus are commonly used to transfer images from a reticle onto a semiconductor wafer during semiconductor processing. A typical exposure apparatus includes an illumination source, a reticle stage assembly that positions a reticle containing one or more patterns, a projection system, a wafer stage assembly that positions a semiconductor wafer, and a measurement system that precisely monitors the positions of the reticle and the wafer. As is known, lithography exposure apparatus also can be used to form images on substrates other than semiconductor wafers, for example, glass or quartz substrates in order to form, for example, flat panel displays such as LCD displays.

Immersion lithography is a technique that can enhance the resolution of lithography exposure apparatus by permitting exposure to take place with a numeral aperture (NA) that is greater than the NA that can be achieved in conventional "dry" lithography exposure apparatus. By filling the space between the final optical element of the projection system and the resist-coated target (wafer or other substrate), immersion lithography permits exposure with light that would otherwise be internally reflected at an optic-air interface. Numerical apertures as high as the index of the immersion fluid (or of the resist or lens material, whichever is least) are possible in immersion lithography systems. Liquid immersion also increases the wafer depth-of-focus, that is, the tolerable error in the vertical position of the wafer, by the index of the immersion fluid compared to a dry system having the same numerical aperture. Immersion lithography thus has the potential to provide resolution enhancement equivalent to a shift from 248 nm to 193 nm without actually decreasing the exposure light wavelength. Thus, unlike a shift in the exposure light wavelength, the use of immersion would not require the development of new light sources, optical materials (for the illumination and projection systems) or coatings, and should allow the use of the same or similar resists as conventional "dry" lithography at the same wavelength. In an immersion system in which only the final optical element of the projection system and its housing and the wafer (and perhaps portions of the stage as well) are in contact with the immersion fluid, much of the technology and design developed for dry lithography can carry over directly to immersion lithography.

However, because the wafer (or other substrate) moves rapidly in a typical lithography system, the immersion fluid in the immersion area tends to be carried away from the immersion area. If the immersion fluid escapes from the immersion area, that fluid can interfere with operation of other components of the lithography system. One way of attempting to prevent the escape of the immersion fluid is to form an immersion fluid barrier around the immersion area by supplying a pressurized gas to the region adjacent to the immersion area. Examples of such systems are shown in WO2004/090634 (corresponding to US 2006/0028632A1), US 2004/0165159A1, US 2004/0207824A1 (issued as U.S. Pat. No. 6,952,253) and US 2005/0007569A1. The disclosures of US 2006/0028632A1, US 2004/0165159A1, US 2004/0207824A1, U.S. Pat. No. 6,952,253 and US 2005/0007569A1 are incorporated herein by reference in their entireties.

SUMMARY

The use of a lower density fluid such as pressurized gas to confine a higher density fluid such as immersion liquid (for example, water) can trigger an instability such as a Rayleigh-Taylor instability at the interface between the gas and liquid. This can cause fingers of the immersion liquid to form and possibly pass through the immersion fluid barrier formed by the pressurized gas, while simultaneously fingers of gas can penetrate into the immersion liquid. These fingers of gas and immersion liquid can create air bubbles in the immersion liquid and droplets of liquid outside of the immersion area (and outside of the immersion fluid barrier), which can adversely affect the lithography process and apparatus.

According to aspects of the invention, by intermittently stopping the supply of pressurized gas to the immersion fluid barrier system, generation of the instability can be limited. The instability grows from small fluctuations of the fluid interface, which are always present. The growth of the instability to an amplitude where significant mixing of the gas and liquid can occur can be limited by limiting the amount of time the pressurized gas is applied to the liquid. For example, the supply of the pressurized gas to the immersion fluid barrier is temporarily stopped for a short amount of time, during which the amplitude of any existing instability has a chance to decay back to the level of the initial fluctuations. Although stopping the supply of gas will permit the immersion fluid to penetrate further into the immersion fluid barrier region, the supply of pressurized gas to the immersion fluid barrier system is resumed before the immersion fluid escapes from the immersion fluid barrier. Resumption of the supply of pressurized gas to the immersion fluid barrier will force the immersion fluid back into the immersion area, thus preventing the escape of immersion fluid from the immersion fluid barrier system.

A Rayleigh-Taylor instability describes the instability of the interface between two fluids which arises when attempting to contain a high density fluid by a low density fluid. In addition to interacting with the immersion fluid barrier system, the immersion fluid interacts with the wafer surface. This latter interaction will not eliminate a Rayleigh-Taylor instability, but it may alter some of its characteristics. Thus, while theories of the Rayleigh-Taylor instability exist, they may have limited predictive power in the present application, and empirical methods may be required to characterize the instability. For example the theory may not accurately predict the growth rate of the instability or its rate of decay.

According to one embodiment, a containment system that contains an immersion fluid in an immersion area defined by the gap between a projection system and an object to be exposed through the immersion fluid is disclosed. The containment system includes a plurality of gas-supply ports located adjacent to the immersion area and a gas control system that controls a supply of a pressurized gas to the plurality of gas-supply ports. The plurality of gas-supply ports are positioned so as to form an immersion fluid barrier that substantially maintains the immersion fluid in the immersion area when the pressurized gas is being ejected from the plurality of gas-supply ports. The gas control system intermittently stops the supply of the pressurized gas to the plurality of gas-supply ports.

The gas control system intermittently stops the supply of the pressurized gas to the plurality of gas-supply ports while the immersion fluid is present in the immersion area. The supply of the pressurized gas can be intermittently stopped during an exposure operation of the object. According to some embodiments, the gas control system temporarily stops the supply of the pressurized gas to the plurality of gas-supply ports at least once during exposure of each shot area on the object. Alternatively, or in addition, the gas control system can temporarily stop the supply of the pressurized gas to the plurality of gas-supply ports at least once during movement of the object between shot areas on the object. If the supply of pressurized gas is temporarily stopped during exposure of a shot area and during movement of the object between shot areas, preferably the gas control system stops the supply of the pressurized gas more times between shot areas than during exposure of each of the shot areas.

The duration of each stoppage of the supply of the pressurized gas by the gas control system is sufficiently short that the immersion fluid does not completely pass beneath the area where the immersion fluid barrier is formed. The duration of each stoppage depends on various factors including properties of the liquid used as the immersion fluid, such as surface tension, viscosity, density and possibly the liquid's contact angle with the wafer, the dimensions of the immersion fluid barrier region, and the effective acceleration imposed on the liquid by the gas during stage motion.

According to preferred embodiments, the containment system also includes gas removal ports that apply a vacuum to the immersion fluid barrier system to remove some of the immersion fluid that has penetrated into the immersion fluid barrier system. According to some embodiments, a supply of the vacuum to the gas removal ports is stopped when the gas control system temporarily stops the supply of the pressurized gas to the plurality of gas-supply ports. According to other embodiments, a supply of the vacuum to the gas removal ports is maintained when the gas control system temporarily stops the supply of the pressurized gas to the plurality of gas-supply ports.

According to preferred embodiments, the immersion fluid barrier system encircles the immersion area. Thus, preferably the gas-supply ports and the gas removal ports (if present) also encircle the immersion area.

Other aspects of the invention relate to an exposure apparatus for transferring an image onto an object. The exposure apparatus preferably includes a projection system, a stage for holding the object during exposure, and an immersion fluid supply system that supplies an immersion fluid to an immersion area to fill a gap between the projection system and the object held by the stage with the immersion fluid, and a containment system that intermittently stops the supply of a pressurized gas to an immersion fluid barrier formed adjacent to the immersion area.

Other aspects of the invention relate to processes for manufacturing a device utilizing an exposure apparatus having a containment system that intermittently stops the supply of a pressurized gas to an immersion fluid barrier formed adjacent to the immersion area.

BRIEF DESCRIPTION OF THE DRAWINGS

The invention will be described in conjunction with the following drawings of exemplary embodiments in which like reference numerals designate like elements, and in which:

FIG. 4A shows an immersion fluid barrier in which the supply of the pressurized gas is ON;

DETAILED DESCRIPTION OF EMBODIMENTS

Figure 1:
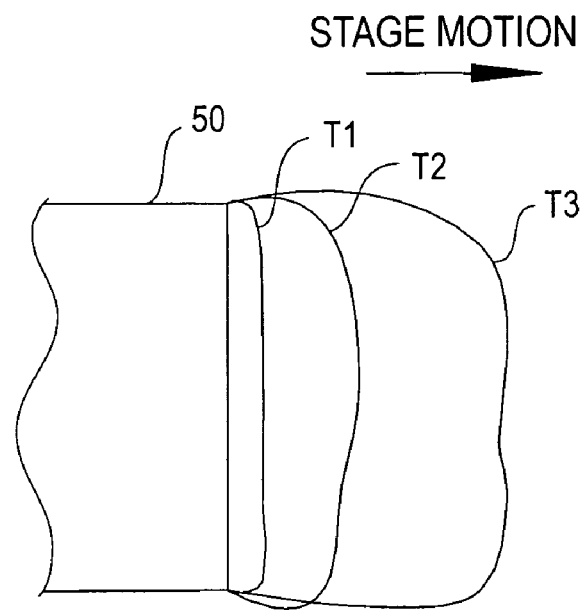
FIG. 1 schematically illustrates an immersion nozzle and the spreading of immersion fluid from beneath that nozzle during stage movement.
Figure 2:
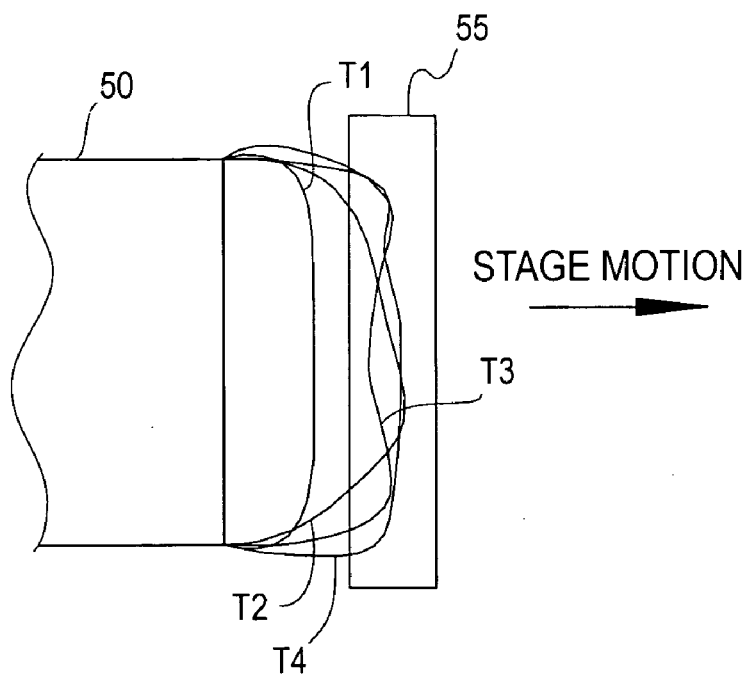
FIG. 2 shows an immersion fluid barrier containing immersion fluid adjacent to the immersion nozzle.
Figure 3:
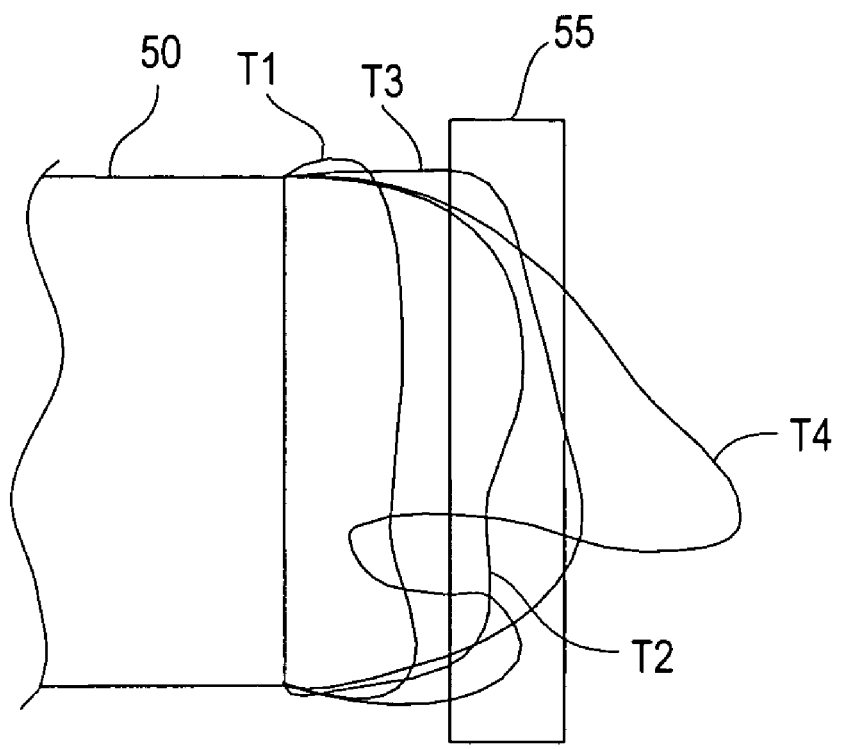
FIG. 3 illustrates the formation of fingers of immersion fluid penetrating through the immersion fluid barrier due to a fluid interface instability.

FIGS. 1-3 first will be described in order to provide a general understanding of some phenomenon that take place during immersion exposure.

FIG. 1 schematically illustrates an immersion nozzle 50 that supplies immersion liquid to an immersion area so that a gap formed between a projection system and an object to be exposed is filled with the immersion liquid. The immersion nozzle 50 is viewed from above and the stage motion is from left-to-right as illustrated by the arrow in FIG. 1. As the stage holding the object moves from left-to-right, the immersion fluid will tend to spread from below the immersion nozzle over time as illustrated by T1, T2 and T3. That is, at time T1, the immersion fluid has spread by a relatively small amount, whereas at subsequent time T2 and further subsequent time T3, the immersion fluid spreads by greater amounts.

As is known, in order to prevent the excessive spreading of the immersion fluid below the immersion nozzle 50, an immersion fluid barrier 55 can be formed by supplying a pressurized gas to an area adjacent to the immersion area formed by the immersion nozzle 50. FIG. 2 illustrates the immersion fluid barrier 55 located on one side of the immersion nozzle 50. The immersion fluid barrier system has a housing attached to the nozzle, which provides a surface parallel with the wafer, beneath which the immersion fluid may flow. Near the outer periphery of the housing are located inlets for the introduction of pressurized gas that provides a barrier for the spreading of the immersion fluid. Of course, the immersion fluid barrier typically is formed on more than one side of the immersion nozzle 50, and preferably encircles the immersion nozzle 50. See, for example, US 2006/0028632A1 and US 2004/0165159A1, incorporated by reference above. In FIG. 2, the stage motion is from left-to-right as in FIG. 1. As shown in FIG. 2, although the immersion fluid spreads from below the immersion nozzle 50 from time T1 to time T4, due to the immersion fluid barrier 55, the immersion fluid is contained from spreading beyond the immersion fluid barrier 55.

However, as discussed previously, because the pressurized gas forming the immersion fluid barrier 55 has a lower density than the immersion fluid (typically a liquid such as water), an instability such as a Rayleigh-Taylor instability can form at the interface between the pressurized gas forming the immersion fluid barrier 55 and the immersion fluid. As shown in FIG. 3, the Rayleigh-Taylor instability can cause fingers of the immersion fluid to penetrate through the immersion fluid barrier 55. As shown in FIG. 3, the immersion fluid begins to penetrate through the immersion fluid barrier 55 at time T3, and significantly penetrates through the barrier 55 at time T4, at which time one or more fingers of the immersion fluid have formed.

The Rayleigh-Taylor instability takes a certain amount of time to form. The amount of time required for the Rayleigh-Taylor instability to develop depends on various factors including properties of the liquid used as the immersion fluid, such as surface tension, viscosity, density and possibly the liquid's contact angle with the wafer, the lateral dimension (in the up-down direction in FIG. 3) of the immersion fluid barrier 55, and the effective acceleration imposed on the liquid by the gas during stage motion.

Rayleigh-Taylor instabilities are described, for example, in Hydrodynamic and Hydromagnetic Stability by S. Chandrasekhar, Dover 1981. A brief description of the salient properties of the Rayleigh-Taylor instability is presented. Let the (unperturbed) interface between the liquid and gas lie in the X-Y plane. Then, perturbations of the interface will extend along the Z direction. Small scale perturbations of the interface may be represented by sinusoidal waves with an exponential growth in time:

$$\exp[ik_x x + ik_y y + nt],\qquad [1]$$

where $n=n(k_x,k_y)$ describes the growth rate of the perturbation, and $k_x$, $k_y$ are the X and Y components of the wave number k:

$$k=[k_x^2+k_y^2]^{1/2}.\qquad [2]$$

Equivalently, this represents a wave on the interface of wavelength $\lambda=2\pi/k$. If the quantity n is positive, the wave grows exponentially; if n is negative the wave decays exponentially. If a first fluid with density $\rho 1$ accelerates (or decelerates) a second fluid with density $\rho 2$, and $\rho 2 > \rho 1$, theory predicts that the interface between the fluids will become unstable for values of k in the range $0 \leq k \leq kc$, where the critical wave number kc is given by $$kc=[(\rho 2-\rho 1)a/\gamma]^{1/2};\qquad [3]$$

a is the acceleration and $\gamma$ the surface tension of the interface. Perturbations with wave numbers greater than kc are not subject to the Rayleigh-Taylor instability, or equivalently wavelengths shorter than $2\pi/kc$. The physical explanation for this is that surface tension stabilization effects become stronger as the wavelength of the perturbation decreases.

For example, if the second fluid is water and the first fluid is a gas, and the interface is accelerated at 1 g=9.78 m/sec$^2$, the critical wave number is approximately kc=368.1 m$^{-1}$; the equivalent wavelength is approximately 17.2 mm. So perturbations of the interface with wavelengths shorter than about 17 mm do not grow exponentially.

For $0 \leq k \leq kc$, the growth rate n varies with k. For fluids with low viscosities, n is given approximately by the expression $$n^2=ak/(\rho 2+\rho 1)[(\rho 2-1)-k^2\gamma/a].\qquad [4]$$

For the water-gas conditions, the maximum value of n is approximately 37 sec$^{-1}$ for k=213 m$^{-1}$, corresponding to a wavelength of about 29 mm. This means that in a time $\frac{1}{37}$=0.027 sec, the perturbation with this wave number grows by the factor e$^1$=2.718. How much a perturbation can be amplified before seriously destabilizing the interface is not known, and must be determined empirically, but is probably at least several time constants. At that point the confining pressurized gas jet must be interrupted, so that the instability can decay. If a comparable time is required for the perturbation amplitude to decay, before reactivating the gas jet, then the cycle time of the gas jet may be of the order of 0.1-0.2 sec, corresponding to a cycle rate of 5-10 Hz. This rate will depend on the operating conditions. For example, if the acceleration of the interface is less than 1 g, the growth rate, and corresponding cycle time, will be reduced.

This example is for water. These conditions must be reexamined for other immersion fluids, with different densities, surface tensions and viscosities. As might be expected, fluids with higher surface tensions and viscosities are more resistant to this instability.

The above theory suggests that another means of damping the instability is to prevent the wavelength of perturbations from exceeding the critical wavelength $\lambda c=2\pi/kc$. If the length of the interface confined by the gas jet is less than this value, the instability will be difficult to excite. If this length is inconveniently small, means to interrupt perturbations with wavelengths exceeding this value may be applied. For example, mechanical ribs extending into the immersion fluid, under the nozzle 50 and/or the immersion fluid barrier 55 and separated by distances of approximately $\lambda c$, may retard the growth of instabilities.

An implicit assumption in the above description is that the instability of the interface is primarily in the horizontal plane. Perturbations in the vertical plane are possible in principle, but immersion nozzle assemblies typically operate with vertical gaps between the nozzle lower surface and the wafer of only a few mm or less. This gap is much smaller than the critical wavelength, so surface tension forces would prevent such a perturbation from growing into an instability. Therefore only horizontal instabilities are considered.

Note that the above remarks do not include any possible effects from the interaction between the immersion fluid and the wafer surface.

Accordingly, if the supply of pressurized gas to the immersion fluid barrier is temporarily stopped, the Rayleigh-Taylor instability should decrease. Although the immersion fluid will, of course, begin to flow through the immersion fluid barrier when the supply of pressurized gas is stopped, the immersion fluid can be prevented from passing entirely through the immersion fluid barrier by resuming the supply of the pressurized gas to the immersion fluid barrier before complete penetration of the immersion fluid through the immersion fluid barrier occurs. It may be desirable to make the immersion fluid barrier wider (in the left-right direction in FIG. 3) than the conventional barrier in order to prevent the immersion fluid from penetrating entirely through the immersion fluid barrier during the brief amount of time that the supply of pressurized gas to the immersion fluid barrier is stopped.

Figure 4A:
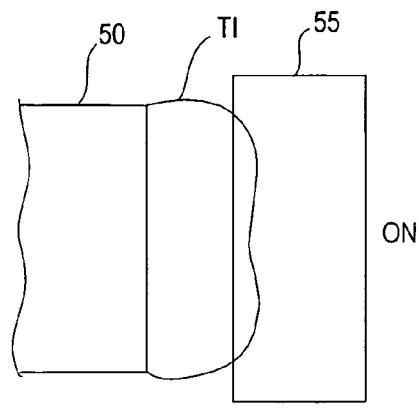
Figure 4B:
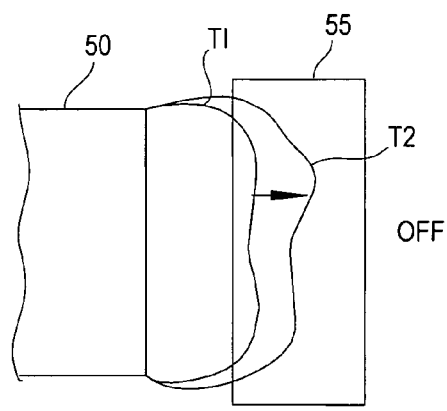
FIG. 4B shows a state subsequent to that of FIG. 4A and in which the supply of the pressurized gas is OFF.
Figure 4C:
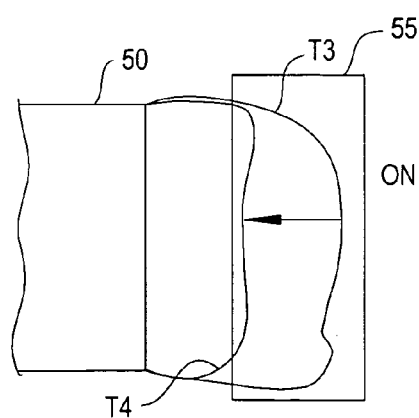
FIG. 4C shows a state subsequent to that of FIG. 4B and in which the supply of pressurized gas has been resumed.

FIGS. 4A-4C schematically illustrate the manner in which the invention works. As shown in FIG. 4A, an immersion fluid barrier 55 is formed adjacent to the immersion area that is formed below an immersion nozzle 50. In FIG. 4A, pressurized gas is supplied to the immersion fluid barrier 55 (that is, the supply of pressurized gas is ON). Thus, as of time T1, the immersion fluid that has spread from below the immersion fluid nozzle 50 does not penetrate entirely through the immersion fluid barrier 55, although it may penetrate slightly into the barrier as illustrated in FIG. 4A.

Before any Rayleigh-Taylor instabilities form, the supply of pressurized gas to the immersion fluid barrier 55 is stopped (that is, the supply of pressurized gas is OFF) as illustrated in FIG. 4B. The immersion fluid spreads to the area illustrated by T2 in FIG. 4B while the supply of pressurized gas to the immersion fluid barrier 55 is off.

However, before the immersion fluid entirely penetrates through the immersion fluid barrier 55, the supply of pressurized gas to the immersion fluid barrier 55 is resumed (the supply of pressurized gas is returned to ON) as shown in FIG. 4C. The immersion fluid has spread to cover the area denoted by T3 at the point in time when the supply of pressurized gas to the immersion fluid barrier 55 is resumed. Then, by subsequent time T4, the immersion fluid is moved back to the smaller area after the supply of pressurized gas to the immersion fluid barrier 55 has been resumed.

Figure 5:
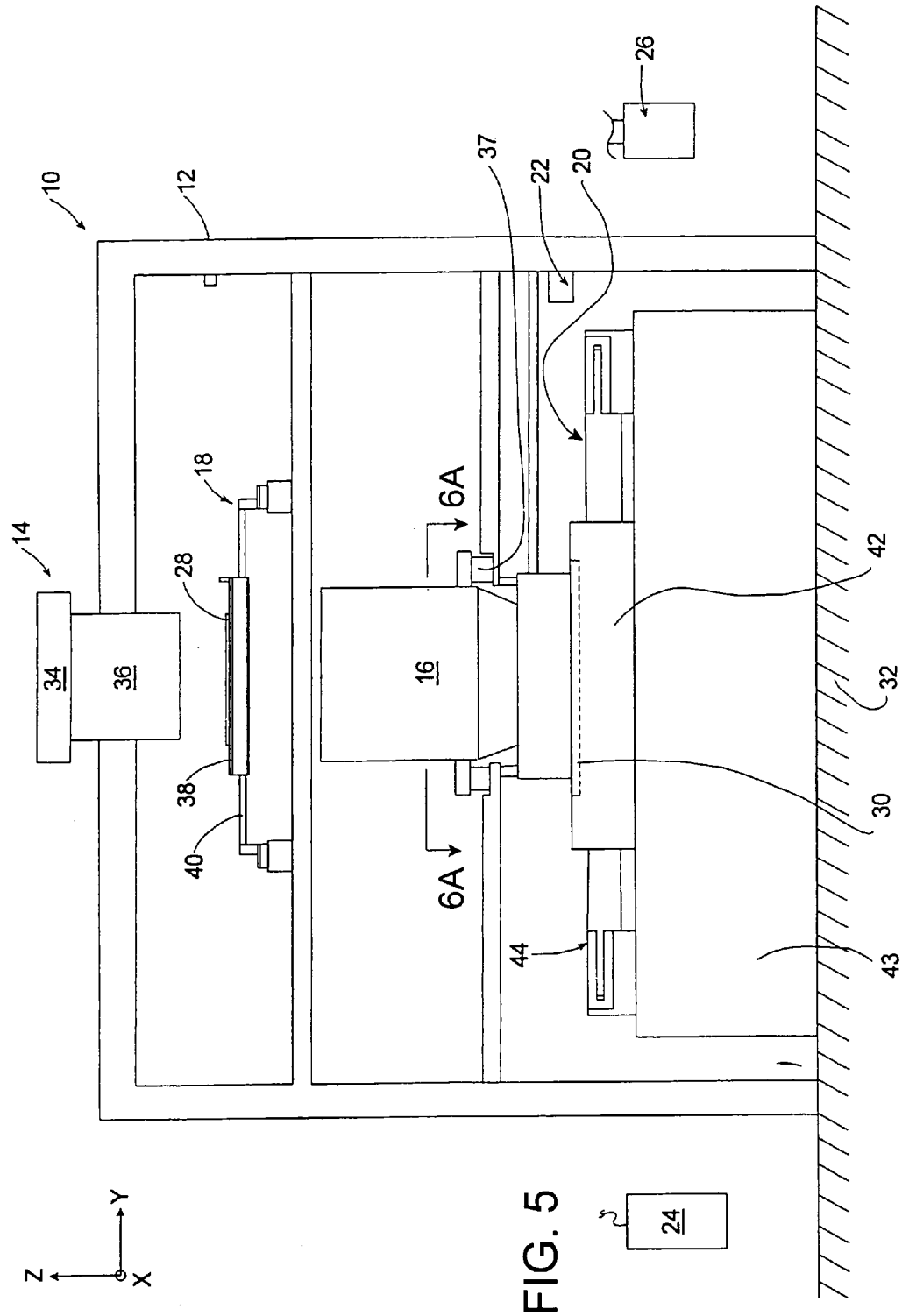
FIG. 5 is a side illustration of an exposure apparatus having features of the invention.

FIG. 5 is a schematic illustration of a precision assembly, namely an exposure apparatus 10 having features of the invention. The exposure apparatus 10 includes an apparatus frame 12, an illumination system 14 (irradiation apparatus), a projection system 16, a reticle stage assembly 18, an object (or substrate) stage assembly 20, a measurement system 22, a control system 24, and an immersion fluid supply system (including a containment system according to the invention) 26. The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 28 onto a semiconductor wafer 30 (illustrated in phantom). The wafer 30 is also referred to generally as a substrate or work piece. The exposure apparatus 10 mounts to a mounting base 32, e.g., the ground, a base, or floor or some other supporting structure.

There are a number of different types of lithographic devices. For example, the exposure apparatus 10 can be used as a scanning type photolithography system that exposes the pattern from the reticle 28 onto the wafer 30 while the reticle 28 and the wafer 30 are moving synchronously. In a scanning type lithographic device, the reticle 28 is moved perpendicularly to an optical axis of the projection system 16 by the reticle stage assembly 18 and the wafer 30 is moved perpendicularly to the optical axis of the projection system 16 by the wafer stage assembly 20. Irradiation of the reticle 28 and exposure of the wafer 30 occur while the reticle 28 and the wafer 30 are moving synchronously.

Alternatively, the exposure apparatus 10 can be a step-and-repeat type photolithography system that exposes the pattern from the reticle 28 onto the wafer 30 while the reticle 28 and the wafer 30 are stationary. In the step and repeat process, the wafer 30 is in a constant position relative to the reticle 28 and the projection system 16 during the exposure of an individual field (shot area). Subsequently, between consecutive exposure steps, the wafer 30 is consecutively moved with the wafer stage assembly 20 perpendicularly to the optical axis of the projection system 16 so that the next shot area of the wafer 30 is brought into position relative to the projection system 16 and the reticle 28 for exposure. Following this process, the images on the reticle 28 are sequentially exposed onto the shot areas of the wafer 30, and then the next shot area of the wafer 30 is brought into position relative to the projection system 16 and the reticle 28.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 supports the components of the exposure apparatus 10. The apparatus frame 12 illustrated in FIG. 5 supports the reticle stage assembly 18, the wafer stage assembly 20, the projection system 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the projection system 16. The beam illuminates selectively different portions of the reticle 28 and exposes the wafer 30. In FIG. 5, the illumination source 34 is illustrated as being supported above the reticle stage assembly 18. Typically, however, the illumination source 34 is secured to one of the sides of the apparatus frame 12 (or is completely separated from the frame 12) and the energy beam from the illumination source 34 is directed to above the reticle stage assembly 18 with the illumination optical assembly 36.

The illumination source 34 can be a light source such as, for example, a mercury g-line source (436 nm) or i-line source (365 nm), a KrF excimer laser (248 nm), an ArF excimer laser (193 nm) or a $F_2$ laser (157 nm). The projection system 16 projects and/or focuses the light passing through the reticle 28 onto the wafer 30. Depending upon the design of the exposure apparatus 10, the projection system 16 can magnify or reduce the image illuminated on the reticle 28. It also could be a 1× magnification system.

When far ultra-violet radiation such as from the excimer laser is used, glass materials such as quartz and fluorite that transmit far ultra-violet rays can be used in the projection system 16. The projection system 16 can be catadioptric, refractive or completely reflective.

With an exposure device that employs radiation of wavelength 200 nm or lower, use of the catadioptric type optical system can be considered. Examples of the catadioptric type of optical system are shown in U.S. Pat. No. 5,668,672 and U.S. Pat. No. 5,835,275. In these cases, the reflecting optical device can be a catadioptric optical system incorporating a beam splitter and concave mirror. U.S. Pat. No. 5,689,377 and U.S. patent application Ser. No. 08/873,605 (Application Date: Jun. 12, 1997) also use a reflecting-refracting type of optical system incorporating a concave mirror, etc., but without a beam splitter, and can also be employed with this invention. The disclosures of the above-mentioned U.S. patents and application are incorporated herein by reference in their entireties.

In one embodiment, the projection system 16 is secured to the apparatus frame 12 with one or more optical mount isolators 37. The optical mount isolators 37 inhibit vibration of the apparatus frame 12 from causing vibration of the projection system 16. Each optical mount isolator 37 can include a pneumatic cylinder (not shown) that isolates vibration and an actuator (not shown) that isolates vibration and controls the position with at least two degrees of motion. Suitable optical mount isolators 37 are sold by Integrated Dynamics Engineering, located in Woburn, Mass. For ease of illustration, two spaced apart optical mount isolators 37 are shown as being used to secure the projection system 16 to the apparatus frame 12. However, for example, three spaced apart optical mount isolators 37 can be used to kinematically secure the projection system 16 to the apparatus frame 12.

The reticle stage assembly 18 holds and positions the reticle 28 relative to the projection system 16 and the wafer 30. In one embodiment, the reticle stage assembly 18 includes a reticle stage 38 that retains the reticle 28 and a reticle stage mover assembly 40 that moves and positions the reticle stage 38 and reticle 28.

Somewhat similarly, the wafer stage assembly 20 holds and positions the wafer 30 with respect to the projected image of the illuminated portions of the reticle 28. In one embodiment, the wafer stage assembly 20 includes a wafer stage 42 that retains the wafer 30, a wafer stage base 43 that supports and guides the wafer stage 42, and a wafer stage mover assembly 44 that moves and positions the wafer stage 42 and the wafer 30 relative to the projection system 16 and the wafer stage base 43. The wafer stage 42 is described in more detail below.

Each stage mover assembly 40, 44 can move the respective stage 38, 42 with three degrees of freedom, less than three degrees of freedom, or more than three degrees of freedom. For example, in alternative embodiments, each stage mover assembly 40, 44 can move the respective stage 38, 42 with one, two, three, four, five or six degrees of freedom. The reticle stage mover assembly 40 and the wafer stage mover assembly 44 can each include one or more movers, such as rotary motors, voice coil motors, linear motors utilizing a Lorentz force to generate drive force, electromagnetic movers, planar motors, or other force movers.

Alternatively, one of the stages could be driven by a planar motor that drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage base and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,118. Additionally, reaction forces generated by the reticle (mask) stage motion can be mechanically transferred to the floor (ground) by use of a frame member as described in U.S. Pat. No. 5,874,820. The disclosures of U.S. Pat. Nos. 5,528,118 and 5,874,820 are incorporated herein by reference in their entireties.

The measurement system 22 monitors movement of the reticle 28 and the wafer 30 relative to the projection system 16 or some other reference. With this information, the control system 24 can control the reticle stage assembly 18 to precisely position the reticle 28 and the wafer stage assembly 20 to precisely position the wafer 30. The design of the measurement system 22 can vary. For example, the measurement system 22 can utilize multiple laser interferometers, encoders, mirrors, and/or other measuring devices. The stability of the measurement system 22 is essential for accurate transfer of an image from the reticle 28 to the wafer 30.

The control system 24 receives information from the measurement system 22 and controls the stage mover assemblies 40, 44 to precisely position the reticle 28 and the wafer 30. Additionally, the control system 24 can control the operation of the immersion fluid supply system 26 (including the contaminant system). The control system 24 can include one or more processors and circuits.

The immersion fluid supply system 26 controls the supply of fluid in a gap 246 (illustrated in FIG. 6B) between the projection system 16 and the wafer 30. The gap 246 includes an imaging field 250 (illustrated in FIG. 6A). The imaging field 250 includes the area adjacent to the region of the wafer 30 that is being exposed and the area in which the beam of light energy travels between the projection system 16 and the wafer 30. With this design, the immersion fluid supply system 26 can control the state of the fluid in the imaging field 250.

The desired state of the fluid created and/or controlled in the gap 246 by the system 26 can vary according to the wafer 30 and the design of the rest of the components of the exposure apparatus 10, including the illumination system 14. For example, the desired controlled state can be a state in which a liquid such as water is consistently maintained in the gap without any bubbles. The system 26 is based on the system disclosed in the above-incorporated US 2006/0028632A1; however many other systems are possible.

Figure 6A:
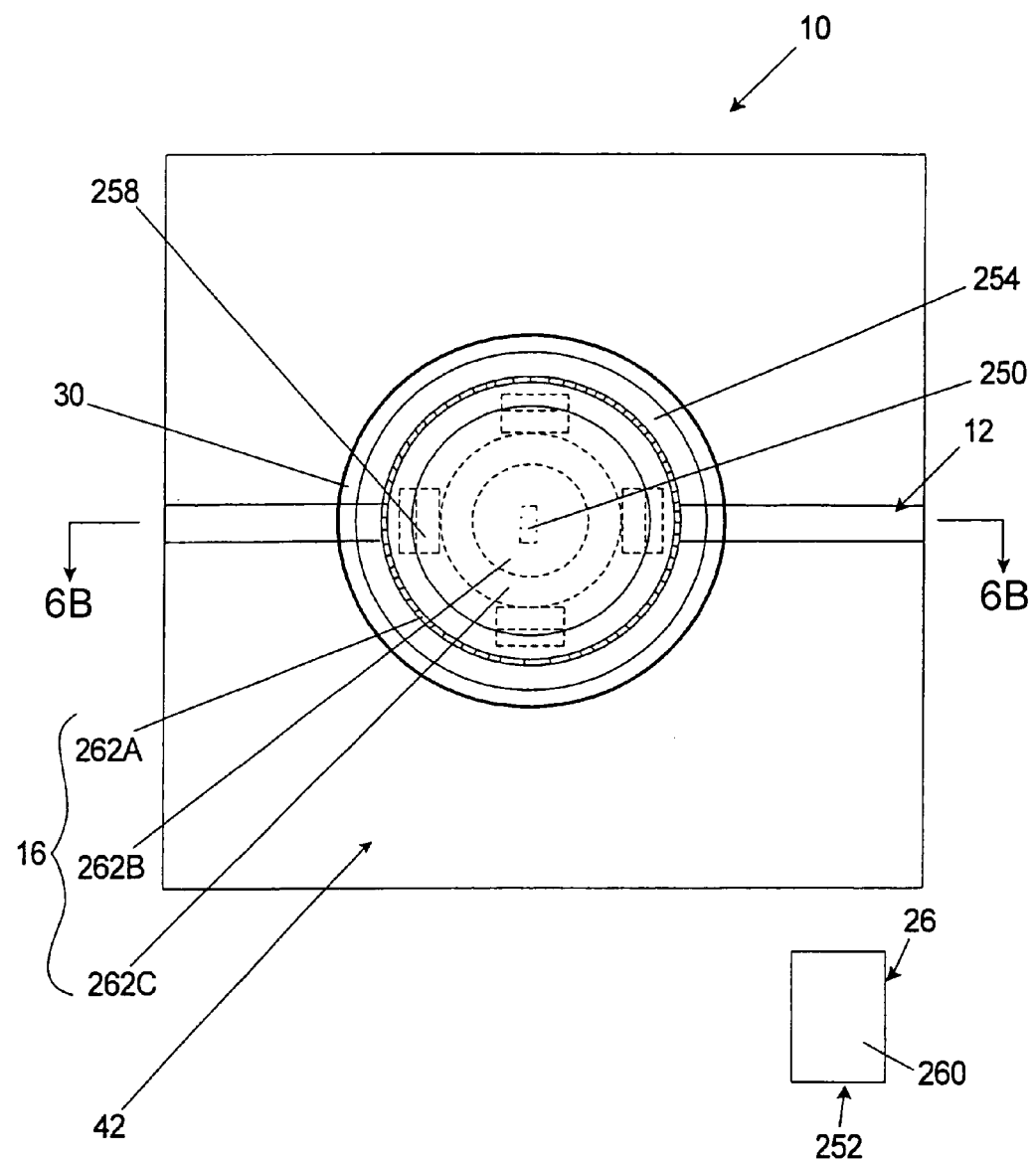
FIG. 6A is a cut-away view taken on line 6A-6A of FIG. 5.

FIG. 6A is a cut-away view taken on line 6A-6A in FIG. 5 that illustrates a portion of the exposure apparatus 10 including the projection system 16, the wafer stage 42, the immersion fluid supply system 26, and the wafer 30. The imaging field 250 (illustrated in phantom) also is illustrated in FIG. 6A.

Figure 6B:
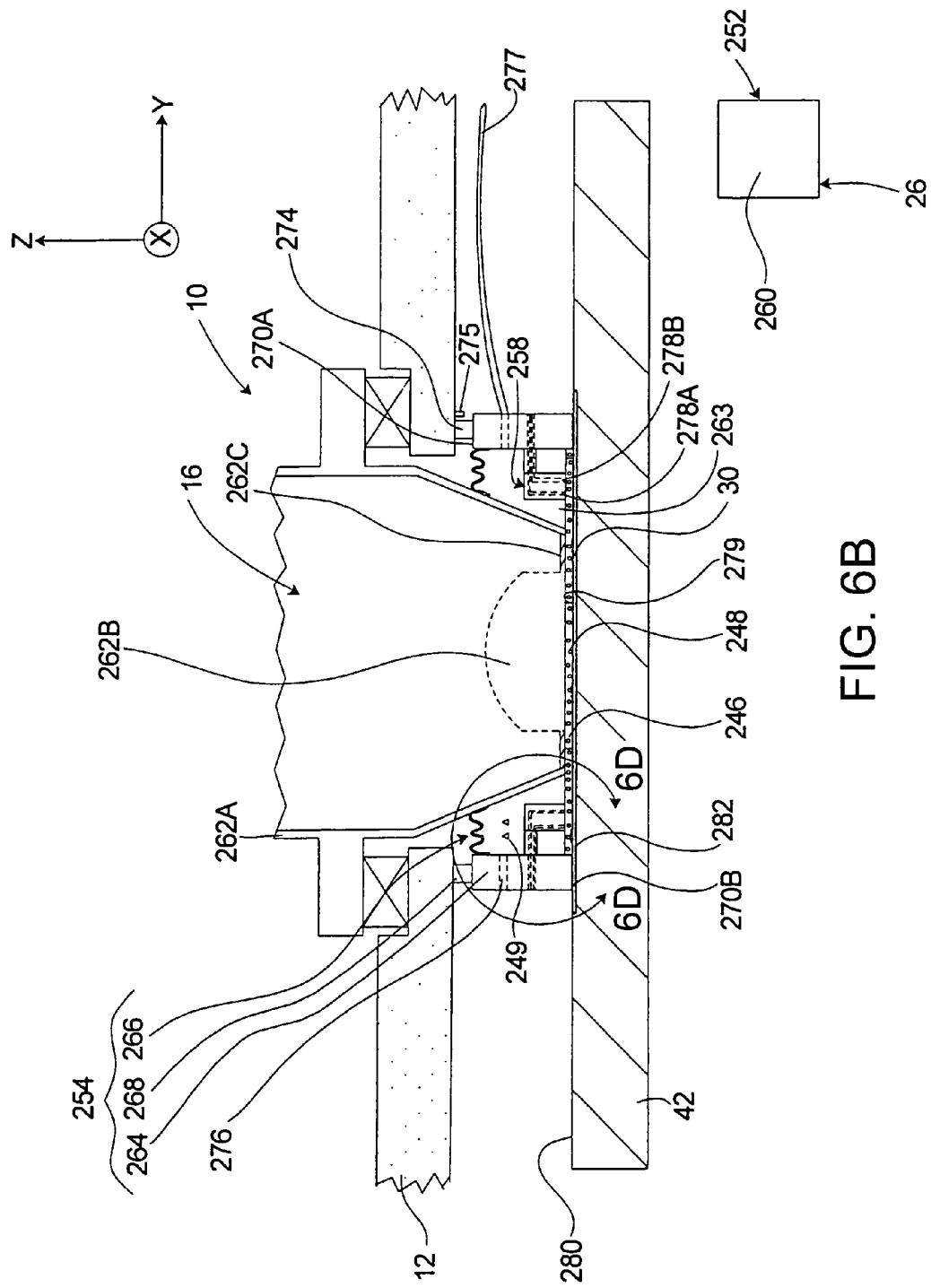
FIG. 6B is a cut-away view taken on line 6B-6B of FIG. 6A.

In one embodiment, the immersion fluid supply system 26 fills the imaging field 250 and the rest of the gap 246 (illustrated in FIG. 6B) with an immersion fluid 248 (illustrated in FIG. 6B). As used herein, the term "fluid" shall mean and include a liquid and/or a gas, including fluid vapor.

The design of the immersion fluid supply system 26 and the components of the system 26 can be varied. In the embodiment illustrated in FIG. 6A, the system 26 includes an immersion fluid system 252 and an injector/scavenge source 260. In this embodiment, (i) the immersion fluid system 252 delivers and/or injects the immersion fluid 248 into the gap 246 and captures the immersion fluid 248 flowing from the gap 246, and (ii) the immersion fluid barrier system 254 inhibits the flow of the immersion fluid 248 away from near the gap 246.

The design of the immersion fluid system 252 can vary. For example, the immersion fluid system 252 can inject the immersion fluid 248 at one or more locations at or near the gap 246 and/or the edge of the projection system 16. Alternatively, the immersion fluid 248 may be injected directly between the projection system 16 and the wafer 30. Further, the immersion fluid system 252 can scavenge the immersion fluid 248 at one or more locations at or near the gap 246 and/or the edge of the projection system 16. In the embodiment illustrated in FIG. 6A, the immersion fluid system 252 includes four spaced apart injector/scavenge pads 258 (illustrated in phantom) positioned near the perimeter of the projection system 16 and an injector/scavenge source 260.

FIG. 6A also illustrates that the projection system 16 includes an optical housing 262A, a last optical element 262B, and an element retainer 262C that secures the last optical element 262B to the optical housing 262A.

FIG. 6B is a cut-away view of the portion of the exposure apparatus 10 of FIG. 6A, including (i) the projection system 16 with the optical housing 262A, the last optical element 262B, and the element retainer 262C, (ii) the wafer stage 42, and (iii) the immersion fluid supply system 26. FIG. 6B also illustrates the gap 246 between the last optical element 262B and the wafer 30, and that the immersion fluid 248 (illustrated as circles) fills the gap 246. In one embodiment, the gap 246 is approximately 1 mm.

In one embodiment, the immersion fluid barrier system 254 contains the immersion fluid 248, including any fluid vapor 249 (illustrated as triangles) in the area near the gap 246 and forms and defines an interior chamber 263 around the gap 246. In the embodiment illustrated in FIG. 6B, the fluid barrier system 254 includes a containment frame 264 (also referred to herein as a surrounding member), a seal 266, and a frame support 268. The interior chamber 263 represents the enclosed volume defined by the containment frame 264, the seal 266, the optical housing 262A and the wafer 30. The immersion fluid barrier system 254 restricts the flow of the immersion fluid 248 from the gap 246, assists in maintaining the gap 246 full of the immersion fluid 248, allows for the recovery of the immersion fluid 248 that escapes from the gap 246, and contains any vapor 249 produced from the fluid. In one embodiment, the fluid barrier system 254 encircles and runs entirely around the gap 246. Further, in one embodiment, the fluid barrier system 254 confines the immersion fluid 248 and its vapor 249 to a region on the wafer 30 and the wafer stage 42 centered on the projection system 16.

Containment of both the immersion fluid 248 and its vapor 249 can be important for the stability of the lithography tool. For example, stage measurement interferometers are sensitive to the index of refraction of the ambient atmosphere. For the case of air with some water vapor present at room temperature and 633 nm laser light for the interferometer beam, a change of 1% in relative humidity causes a change in refractive index of approximately $10^{-8}$. For a 1 m total beam path, this can represent an error of 10 nm in stage position. If the immersion fluid 248 is water, a droplet of water 7 mm in diameter evaporating into a 1 $m^3$ volume changes the relative humidity by 1%. Relative humidity is typically monitored and corrected for by the control system 24, but this is based on the assumption that the relative humidity is uniform, so that its value is the same in the interferometer beams as at the monitoring point. However, if droplets of water and the attendant vapor are scattered around on the wafer and stage surfaces, the assumption of uniform relative humidity may not be valid. If the immersion fluid is not water, containment may be required, in addition, for safety or health reasons.

In addition to the risk to the interferometer beams, water evaporation may also create temperature control problems. The heat of vaporization of water is about 44 kJ/mole. Evaporation of the 7 mm drop mentioned above will absorb about 430 J which must be supplied by the adjacent surfaces.

Figure 6C:
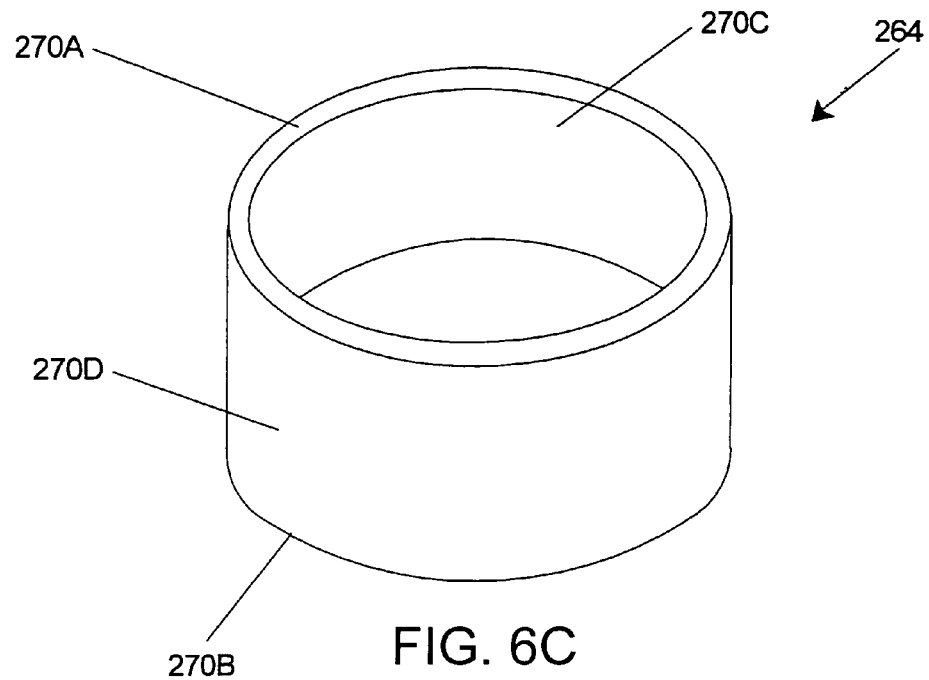
FIG. 6C is a perspective view of a containment frame having features of the invention.

FIG. 6C illustrates a perspective view of one embodiment of the containment frame 264. In this embodiment, the containment frame 264 is annular ring shaped and encircles the gap 246 (illustrated in FIG. 6B). Additionally, in this embodiment, the containment frame 264 includes a top side 270A, an opposite bottom side 270B (also referred to as a first surface) that faces the wafer 30, an inner side 270C that faces the gap 246, and an outer side 270D. The terms top and bottom are used merely for convenience, and the orientation of the containment frame 264 can be rotated. The containment frame 264 can have another shape. Alternatively, for example, the containment frame 264 can be rectangular frame shaped or octagonal frame shaped.

Additionally, as provided herein, the containment frame 264 may be temperature controlled to stabilize the temperature of the immersion fluid 248.

Referring back to FIG. 6B, the seal 266 seals the containment frame 264 to the optical assembly 16 and allows for some motion of the containment frame 264 relative to the optical assembly 16. In one embodiment, the seal 266 is made of a flexible, resilient material that is not influenced by the immersion fluid 248. Suitable materials for the seal 266 include rubber, Buna-N, neoprene, Viton or plastic. Alternatively the seal 266 may be a bellows made of a metal such as stainless steel or rubber or a plastic. In some embodiments, where the effects of water vapor are not a concern, or where vapor from the immersion liquid is suppressed in other ways, the seal 266 can be omitted.

Figure 6D:
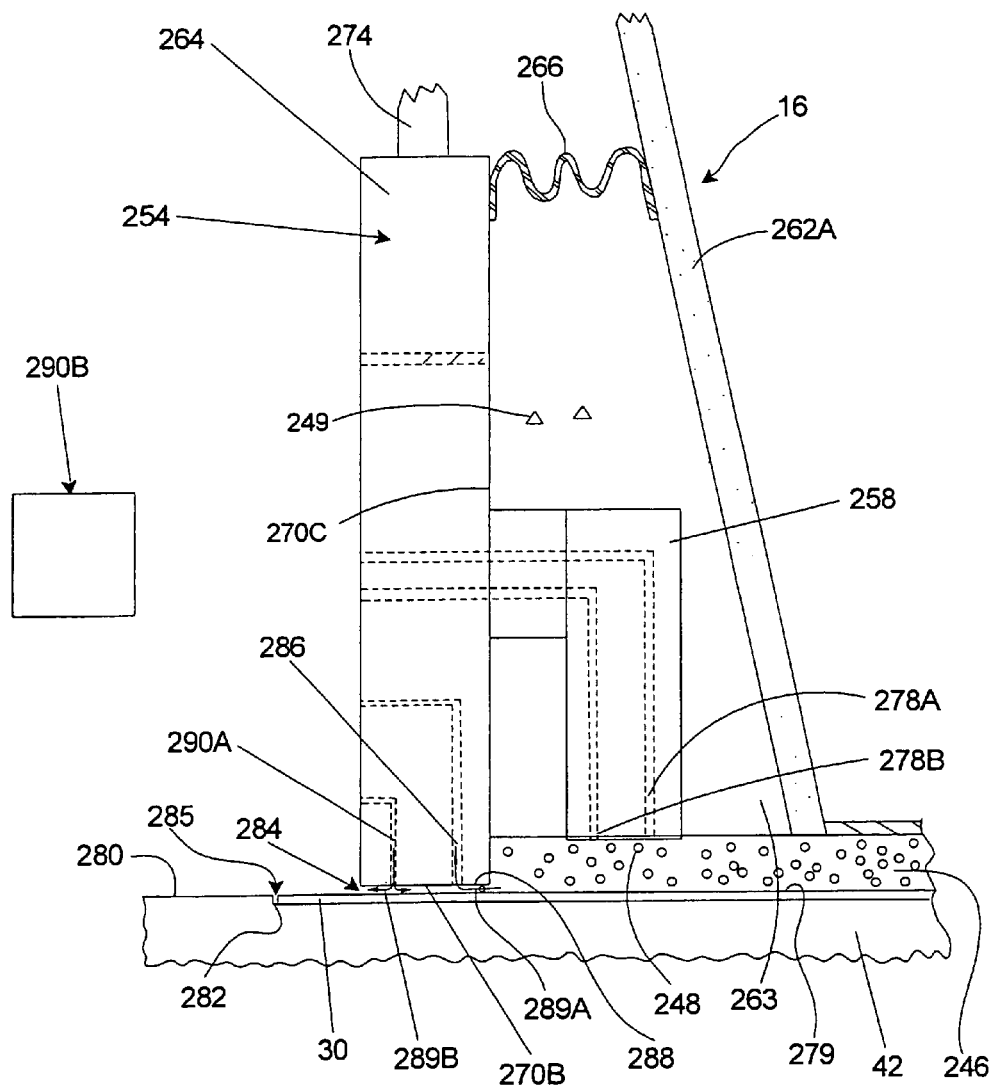
FIG. 6D is an enlarged detailed view taken on line 6D-6D in FIG. 6B.

FIG. 6D illustrates an enlarged view of a portion of FIG. 6B, in partial cut-away. The frame support 268 connects and supports the containment frame 264 to the apparatus frame 12 and the projection system 16 above the wafer 30 and the wafer stage 42. In one embodiment, the frame support 268 supports all of the weight of the containment frame 264. Alternatively, for example, the frame support 268 can support only a portion of the weight of the containment frame 264. In one embodiment, the frame support 268 can include one or more support assemblies 274. For example, the frame support 268 can include three spaced apart support assemblies 274 (only two are illustrated). In this embodiment, each support assembly 274 extends between the apparatus frame 12 and the top side 270A of the containment frame 264.

In one embodiment, each support assembly 274 is a flexure. As used herein, the term "flexure" shall mean a part that has relatively high stiffness in some directions and relatively low stiffness in other directions. In one embodiment, the flexures cooperate (i) to be relatively stiff along the X axis and along the Y axis, and (ii) to be relatively flexible along the Z axis. The ratio of relatively stiff to relatively flexible is at least approximately 100/1, and can be at least approximately 1000/1. Stated another way, the flexures can allow for motion of the containment frame 264 along the Z axis and inhibit motion of the containment frame 264 along the X axis and the Y axis. In this embodiment, each support assembly 274 passively supports the containment frame 264.

Alternatively, for example, each support assembly 274 can be an actuator that can be used to adjust the position of the containment frame 264 relative to the wafer 30 and the wafer stage 42. Additionally, the frame support 268 can include a frame measurement system 275 that monitors the position of the containment frame 264. For example, the frame measurement system 275 can monitor the position of the containment frame 264 along the Z axis, about the X axis, and/or about the Y axis. With this information, the support assemblies 274 can be used to adjust the position of the containment frame 264. In this embodiment, each support assembly 274 can actively adjust the position of the containment frame 264.

In one embodiment, the immersion fluid supply system 26 includes one or more pressure equalizers 276 that can be used to control the pressure in the chamber 263. Stated another way, the pressure equalizers 276 inhibit atmospheric pressure changes or pressure changes associated with the fluid control from creating forces between the containment frame 264 and the wafer 30 or the last optical element 262B. For example, the pressure equalizers 276 can cause the pressure on the inside of the chamber 263 and/or in the gap 246 to be approximately equal to the pressure on the outside of the chamber 263. For example, each pressure equalizer 276 can be a channel that extends through the containment frame 264. In one embodiment, a tube 277 (only one is illustrated) is attached to the channel of each pressure equalizer 276 to convey any fluid vapor away from the measurement system 22 (illustrated in FIG. 1). In alternative embodiments, the pressure equalizer 276 allows for a pressure difference of less than approximately 0.01, 0.05, 0.1, 0.5, or 1.0 PSI. Of course, if the seal 266 is omitted, then pressure equalizers 276 also could be omitted.

FIG. 6B also illustrates several injector/scavenge pads 258. FIG. 6D illustrates one injector/scavenge pad 258 in more detail. In this embodiment, each of the injector/scavenge pads 258 includes a pad outlet 278A and a pad inlet 278B that are in fluid communication with the injector/scavenge source 260. At the appropriate time, the injector/scavenge source 260 provides immersion fluid 248 to the pad outlet 278A that is released into the chamber 263 and draws immersion fluid 248 through the pad inlet 278B from the chamber 263.

FIGS. 6B and 6D also illustrate that the immersion fluid 248 in the chamber 263 sits on top of the wafer 30. As the wafer 30 moves under the projection system 16, it will drag the immersion fluid 248 in the vicinity of a top surface 279 of the wafer 30 with the wafer 30 into the gap 246.

In one embodiment, referring to FIGS. 6B and 6D, the wafer stage 42 includes a stage surface 280 that has approximately the same height along the Z axis as the top, exposed surface 279 of the wafer 30. Stated another way, in one embodiment, the stage surface 280 is in approximately the same plane as the exposed surface 279 of the wafer 30. In alternative embodiments, for example, approximately the same plane shall mean that the planes are within approximately 1, 10, 100 or 500 microns. As a result thereof, the distance between the bottom side 270B of the containment frame 264 and the wafer 30 is approximately equal to the distance between the bottom side 270B of the containment frame 264 and the wafer stage 42. In one embodiment, for example, the wafer stage 42 can include a disk shaped recess 282 for receiving the wafer 30.

FIG. 6D illustrates that a frame gap 284 exists between the bottom side 270B of the containment frame 264 and the wafer 30 and/or the wafer stage 42 to allow for ease of movement of the wafer stage 42 and the wafer 30 relative to the containment frame 264. The size of the frame gap 284 can vary. For example, the frame gap 284 can be between approximately 5 μm and 3 mm. In alternative examples, the frame gap 284 can be approximately 5, 10, 50, 100, 150, 200, 250, 300, 400, or 500 microns.

Additionally, a wafer gap 285 can exist between the edge of the wafer 30 and the wafer stage 42. In one embodiment, the wafer gap 285 is as narrow as possible to minimize leakage when the wafer 30 is off-center from the projection system 16 and lying partly within and partly outside the immersion fluid containment frame 264 region. For example, in alternative embodiments, the wafer gap 285 can be approximately 1, 10, 50, 100, 500, or 1000 microns.

FIG. 6D also illustrates that some of the immersion fluid 248 flows between the containment frame 264 and the wafer 30 and/or the wafer stage 42. In one embodiment, the containment frame 264 includes one or more vacuum ports 286 that are positioned at or near the bottom side 270B of the containment frame 264. The one or more vacuum ports 286 are in fluid communication with the injector/scavenge source 260 (illustrated in FIG. 6B). With this design, the immersion fluid 248 that escapes in the frame gap 284 can be scavenged by the injector/scavenge source 260. In the embodiment illustrated in FIG. 2D, the bottom side 270B of the containment frame 264 includes one vacuum port 286 that is substantially annular groove shaped and is substantially concentric with the projection system 16. Alternatively, for example, the bottom side 270B of the containment frame 264 can include a plurality of spaced apart annular groove shaped vacuum ports 286 that are substantially concentric with the optical assembly 16 to inhibit the immersion fluid 248 from completely exiting the frame gap 284. Still alternatively, a plurality of spaced apart apertures oriented in a circle can be used instead of an annular shaped groove.

In one embodiment, the injector/scavenge source 260 applies a vacuum and/or partial vacuum on the vacuum port (s) 286. The partial vacuum draws the immersion fluid 248 between (i) a small land area 288 on the bottom side 270B, and (ii) the wafer 30 and/or the wafer stage 42. The immersion fluid 248 in the frame gap 284 can act as a fluid bearing 289A (illustrated as an arrow) that supports the containment frame 264 above the wafer 30 and/or the wafer stage 42, allows for the containment frame 264 to float with minimal friction on the wafer 30 and/or the wafer stage 42, and allows for a relatively small frame gap 284. With this embodiment, most of the immersion fluid 248 is confined within the fluid barrier system 254 and most of the leakage around the periphery is scavenged within the narrow frame gap 284.

The frame gap 284 may vary radially, from the inner side 270C to the outer side 270D, to optimize scavenging functions.

In FIG. 6D, a gas-supply port 290A is substantially annular groove shaped, is substantially concentric with the projection system 16 and the vacuum port 286, and has a diameter that is greater than the diameter of the vacuum port 286. That is, the gas-supply port is located radially outward of the vacuum port. Alternatively, for example, the bottom side 270B of the containment frame 264 can include a plurality of spaced apart annular groove shaped, gas-supply ports 290A that are substantially concentric with the projection system 16. Still alternatively, a plurality of spaced apart apertures oriented in a circle can be used instead of an annular shaped groove. Alternatively, the geometry of the gas-supply port 290A may be rectangular.

Figure 7:
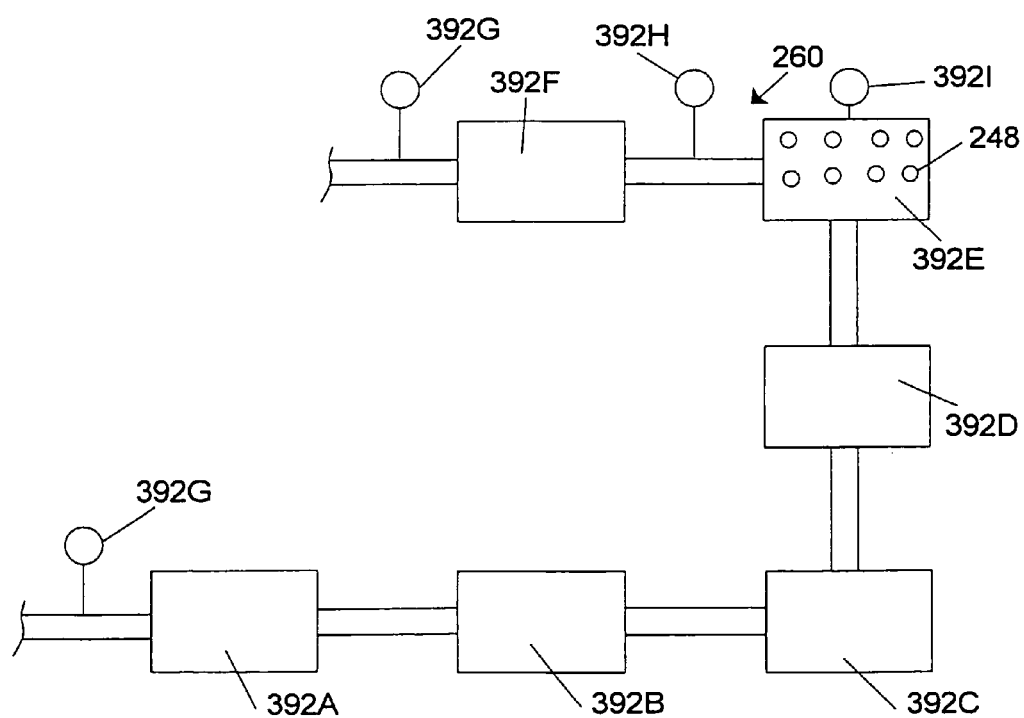
FIG. 7 is a side illustration of an injector/scavenge source having features of the invention.

FIG. 7 illustrates a first embodiment of the injector/scavenge source 260. In this embodiment, the injector/scavenge source 260 includes (i) a low pressure source 392A, e.g., a pump, having an inlet that is at a vacuum or partial vacuum that is in fluid communication with the vacuum ports 286 (illustrated in FIG. 6D) and the pad inlets 278B (illustrated in FIGS. 6B and 6D) and a pump outlet that provides pressurized immersion fluid 248, (ii) a filter 392B in fluid communication with the pump outlet and that filters the immersion fluid 248, (iii) a de-aerator 392C in fluid communication with the filter 392B and that removes any air, contaminants, or gas from the immersion fluid 248, (iv) a temperature control 392D in fluid communication with the de-aerator 392C and that controls the temperature of the immersion fluid 248, (v) a reservoir 392E in fluid communication with the temperature control 392D and that retains the immersion fluid 248, and (vi) a flow controller 392F that has an inlet in fluid communication with the reservoir 392E and an outlet in fluid communication with the pad outlets 278A (illustrated in FIGS. 6B and 6D), the flow controller 392F controlling the pressure and flow to the pad outlets 278A. The operation of these components can be controlled by the control system 24 (illustrated in FIG. 5) to control the flow rate of the immersion fluid 248 to the pad outlets 278A, the temperature of the immersion fluid 248 at the pad outlets 278A, the pressure of the immersion fluid 248 at the pad outlets 278A, and/or the pressure at the vacuum ports 286 and the pad inlets 278B.

Additionally, the injector/scavenge source 260 can include (i) a pair of pressure sensors 392G that measure the pressure near the pad outlets 278A, the vacuum ports 286 and the pad inlets 278B, (ii) a flow sensor 392H that measures the flow to the pad outlets 278A, and/or (iii) a temperature sensor 392I that measures the temperature of the immersion fluid 248 delivered to the pad outlets 278A. The information from these sensors 392G-392I can be transferred to the control system 24 so that that control system 24 can appropriately adjust the other components of the injector/scavenge source 260 to achieve the desired temperature, flow and/or pressure of the immersion fluid 248.

The orientation of the components of the injector/scavenge source 260 can be varied. Further, one or more of the components may not be necessary and/or some of the components can be duplicated. For example, the injector/scavenge source 260 can include multiple pumps, multiple reservoirs, temperature controllers or other components. A vacuum source that is separate from low pressure source 392A can be provided for providing a low pressure to the vacuum ports 286.

The rate at which the immersion fluid 248 is pumped into and out of the chamber 263 (illustrated in FIG. 6B) can be adjusted to suit the design requirements of the system. Further, the rate at which the immersion fluid 248 is scavenged from the pad inlets 278B and the vacuum ports 286 can vary. In one embodiment, the immersion fluid 248 is scavenged from the pad inlets 278B at a first rate and is scavenged from the vacuum ports 286 at a second rate. As an example, the first rate can be between approximately 0.1-5 liters/minute and the second rate can be between approximately 0.01-0.5 liters/minute. However, other first and second rates can be utilized.

The rates at which the immersion fluid 248 is pumped into and out of the chamber 263 can be adjusted to (i) control the leakage of the immersion fluid 248 below the fluid barrier, (ii) control the leakage of the immersion fluid 248 from the wafer gap 285 when the wafer 30 is off-center from the projection system 16, and/or (iii) control the temperature and purity of the immersion fluid 248 in the gap 246. For example, the rates can be increased in the event the wafer 30 is off-center, the temperature of the immersion fluid 248 becomes too high and/or there is an unacceptable percentage of contaminants in the immersion fluid 248 in the gap 246.

The type of immersion fluid 248 can be varied to suit the design requirements of the apparatus 10. In one embodiment, the immersion fluid 248 is water. Alternatively, for example, the immersion fluid 248 can be a fluorocarbon liquid, Fomblin oil, a hydrocarbon oil, or another type of oil. More generally, the fluid should satisfy certain conditions: 1) it must be relatively transparent to the exposure radiation; 2) its refractive index must be comparable to that of the last optical element 262B; 3) it should not react chemically with components of the exposure system 10 with which it comes into contact; 4) it must be homogeneous; and 5) its viscosity should be low enough to avoid transmitting vibrations of a significant magnitude from the stage system to the last optical element 262B.

The pressurized gas ejected from the gas-supply ports 290A forms an immersion fluid barrier (in conjunction with the containment frame 264) that maintains the immersion fluid 248 in the immersion area. The flow of gas is indicated by arrows 289B. As described above in conjunction with FIG. 3, instabilities such as Rayleigh-Taylor instabilities can form in the interface between the lower-density pressurized gas and the higher-density immersion liquid. These instabilities can cause fingers of the immersion fluid to penetrate entirely through the immersion fluid barrier formed by the pressurized gas. In accordance with aspects of the invention, the supply of the pressurized gas to the gas-supply ports 290A is intermittently stopped. In particular, the supply of the pressurized gas to the gas-supply ports 290A is stopped temporarily (for a short time) before any Rayleigh-Taylor instabilities reach appreciable amplitudes. The supply of the pressurized gas to the gas-supply ports 290A then is resumed before any of the immersion fluid penetrates entirely through the immersion fluid barrier region (that is, before any of the immersion fluid passes entirely through the area located below the containment frame 264). The control system 24 controls the pressurized gas supply 290B so as to intermittently stop the supply of the pressurized gas to the gas-supply ports 290A.

The supply of the pressurized gas to the gas-supply ports 290A may be stopped one or more times during the exposure of each shot area on the wafer 30. If, however, it is unlikely that a Rayleigh-Taylor instability will arise in the time period required for exposure of a shot area, it is possible that the supply of pressurized gas to the gas-supply ports 290A can be maintained throughout exposure of an entire shot area. Because a greater amount of time typically is required to move between shot areas, it is more likely for Rayleigh-Taylor instabilities to arise during movement of the wafer between shot areas. Accordingly, the supply of pressurized gas to the gas-supply ports 290A typically is intermittently stopped during movement of the wafer between shot areas, even if the supply is not stopped during exposure of shot areas. Thus, in accordance with aspects of the invention, the supply of pressurized gas to the gas-supply ports 290A is intermittently stopped during an exposure operation, which includes exposure of the shot areas and movement of the wafer between shot areas.

The gas-supply ports 290A are shown pointing downward in FIG. 6D. However, they may be oriented in other directions as well. For example the gas-supply ports 290A may point substantially inward toward the immersion fluid in some embodiments, to increase the pressure on the immersion fluid.

The duration of each stoppage of supply of the pressurized gas to the gas-supply ports 290A depends on various factors including properties of the liquid used as the immersion fluid, such as surface tension, viscosity, density and possibly the liquid's contact angle with the wafer, the lateral dimension of the immersion fluid barrier and the effective acceleration imposed on the liquid by the gas during stage movement.

The supply of vacuum to the vacuum ports 286 provided below the containment frame 264 can be maintained during the times when the supply of pressurized gas to the gas-supply ports 290A is stopped, or the supply of vacuum to the vacuum ports 286 can be stopped during the time periods when the supply of pressurized gas to the gas-supply ports 290A is stopped.

Figures 8A, 8B:
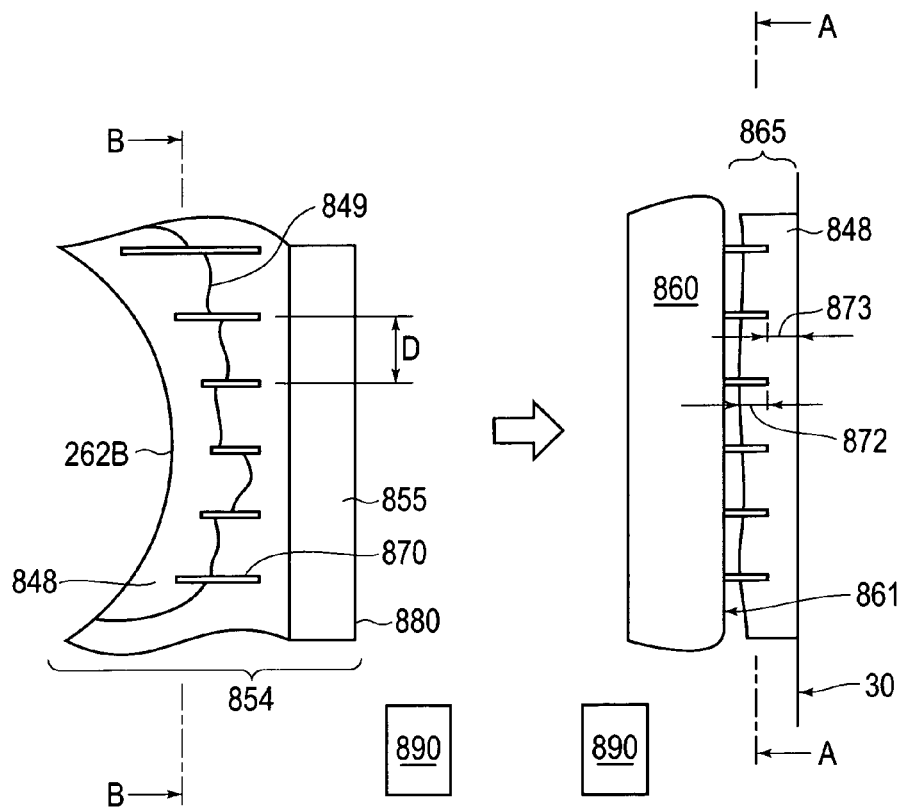
FIG. 8A is a schematic of another embodiment of an immersion fluid barrier system.
FIG. 8B is a view of the embodiment of the immersion fluid barrier system shown in FIG. 8A, taken on line 8B-8B in FIG. 8A.

FIGS. 8A and 8B are schematics of another embodiment of an immersion barrier system 854. A housing 860 provides a horizontal channel 865 through which the immersion fluid can move, between the top of the wafer 30 and the bottom 861 of the housing 860. A gas injection assembly 880 exists at the periphery of the immersion barrier system 854. Pressurized gas jets 855 are generated in the gas injection assembly 880 to contain the immersion fluid 848. A control system 890 turns the pressurized gas jets 855 on and off, to retard generation of Rayleigh-Taylor instabilities in the liquid-gas interface 849.

An arrow in FIG. 8A indicates the direction of stage motion. To further reduce generation of Rayleigh-Taylor instabilities in the liquid-gas interface 849, an array of ribs 870 are attached to the bottom of the housing 860. The ribs extend into part of the channel 865. The distance D between ribs is approximately equal to or less than the critical wavelength $\lambda c$ of perturbations of the liquid-gas interface 849, which can grow into Rayleigh-Taylor instabilities if their wavelength $\lambda > \lambda c$. The ribs make excitation of perturbations with wavelength $\lambda > D$ difficult.

However the ribs 870 penetrate only partway into the channel 865, in order to provide some vertical clearance for the wafer motion. Only the part of the liquid-gas interface 849 lying within the layer 872 will feel the direct effect of the ribs 870 on their perturbations. That part of the liquid-gas interface lying within the layer 873, below the ribs 870, can experience perturbations with wavelengths greater than $\lambda c$, and therefore can be amplified by the Rayleigh-Taylor mechanism. However, since perturbations in only the lower part of the liquid-gas interface 849 are amplified, the upper part of the liquid-gas interface should exert some damping forces on these perturbations, from surface tension and viscous shearing. This should retard the growth of the excitations, improving the performance of the immersion barrier. It may also permit reduction of the on-off cycle rate of the pressurized gas jets and perhaps the required gas pressure.

Figure 8C:
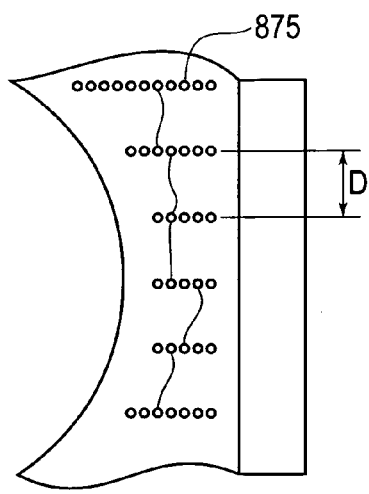
FIG. 8C is a schematic of another embodiment of an immersion fluid barrier system.

FIG. 8C shows another embodiment of the immersion fluid system. The ribs 870 are replaced by arrays of posts 875 extending beneath the housing 860. Each post array is separated by a distance D which is approximately equal to or less than the critical wavelength $\lambda c$.

Figure 9A:
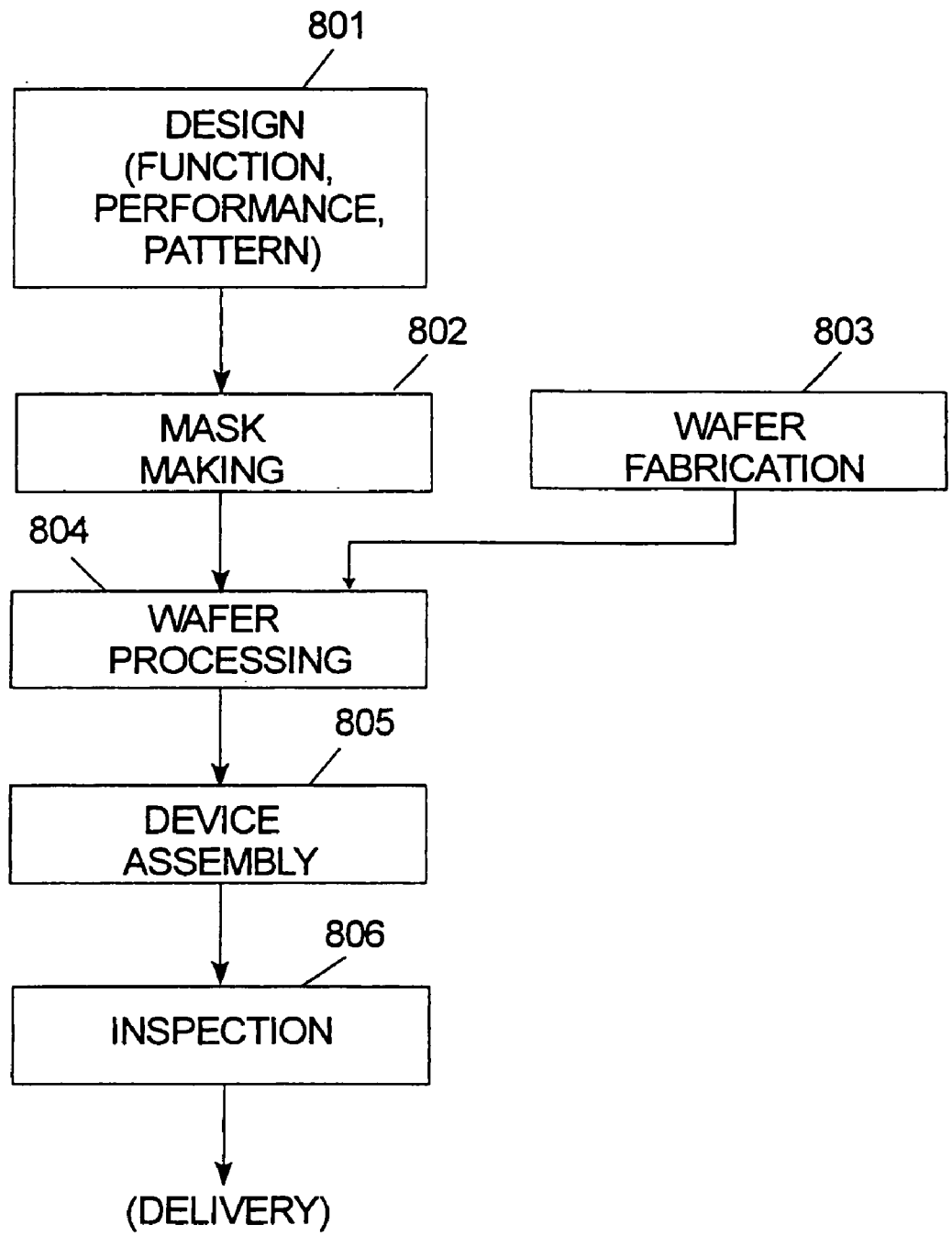
FIG. 9A is a flow chart that outlines a process for manufacturing a device in accordance with the invention.

Semiconductor devices can be fabricated using the above described systems, by the process shown generally in FIG. 9A. In step 801 the device's function and performance characteristics are designed. Next, in step 802, a mask (reticle) having a pattern is designed according to the previous designing step, and in a step 803 a wafer is made from a silicon material. The mask pattern designed in step 802 is exposed onto the wafer from step 803 in step 804 by a photolithography system described hereinabove in accordance with the invention. In step 805 the semiconductor device is assembled (including the dicing process, bonding process and packaging process). Finally, the device is then inspected in step 806.

Figure 9B:
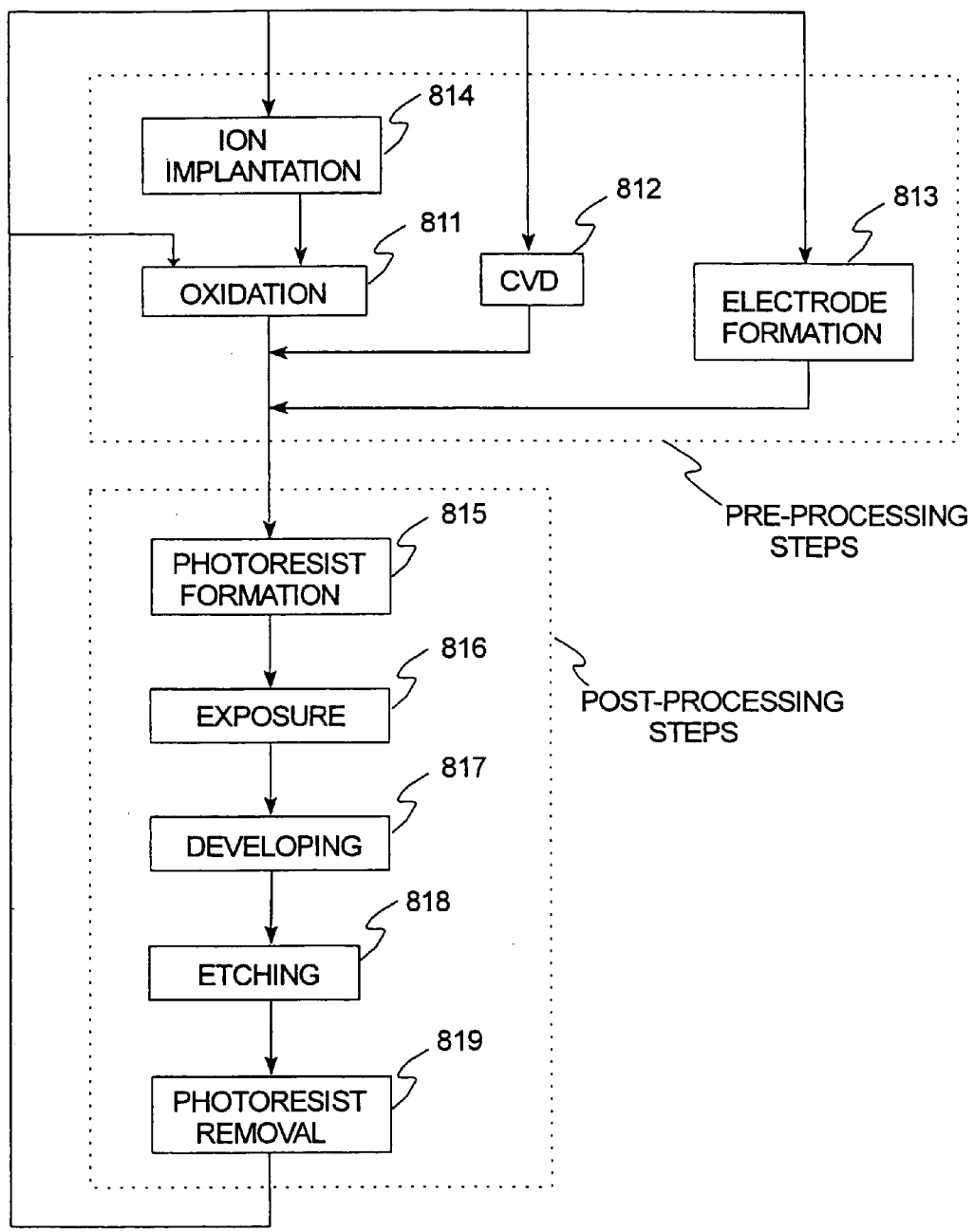
FIG. 9B is a flow chart that outlines device processing in more detail.

FIG. 9B illustrates a detailed flowchart example of the above-mentioned step 804 in the case of fabricating semiconductor devices. In FIG. 9B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

A photolithography system (an exposure apparatus) according to the embodiments described herein can be built by assembling various subsystems in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes providing mechanical interfaces, electrical circuit wiring connections and air pressure plumbing connections between each subsystem. Each subsystem also is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. A containment system that contains an immersion fluid in an immersion area located between a projection system and an object to be exposed by the projection system through the immersion fluid, the containment system comprising:
   an immersion fluid barrier formed by a pressurized gas that is supplied to a location adjacent to the immersion area, wherein a supply of the pressurized gas to the immersion fluid barrier is intermittently stopped during an exposure operation of the object.

2. The containment system of claim 1, further comprising a gas control system that controls the supply of the pressurized gas to the immersion fluid barrier, the gas control system intermittently stopping the supply of the pressurized gas to the immersion fluid barrier.

3. The containment system of claim 2, further comprising a gas source that provides the pressurized gas to the gas control system.

4. The containment system of claim 1, wherein the supply of the pressurized gas to the immersion fluid barrier is temporarily stopped at least once during exposure of each shot area on the object.

5. The containment system of claim 4, wherein the supply of the pressurized gas to the immersion fluid barrier also is temporarily stopped at least once during movement of the object between shot areas on the object, the supply of the pressurized gas to the immersion fluid barrier being stopped more times between shot areas than during exposure of each of the shot areas.

6. The containment system of claim 1, wherein the supply of the pressurized gas to the immersion fluid barrier is temporarily stopped at least once during movement of the object between shot areas on the object.

7. The containment system of claim 1, further comprising an immersion fluid barrier housing that forms part of the immersion fluid barrier, and a plurality of projections that extend from a surface of the immersion fluid barrier housing that faces the object to be exposed.

8. The containment system of claim 7, wherein the projections are ribs or arrays of posts.

9. The containment system of claim 1, further comprising gas removal ports that apply a vacuum to the immersion fluid barrier to remove the pressurized gas and immersion fluid that has penetrated into the immersion fluid barrier.

10. The containment system of claim 9, wherein a supply of the vacuum to the gas removal ports is stopped when the supply of the pressurized gas to the immersion fluid barrier is stopped.

11. The containment system of claim 9, wherein a supply of the vacuum to the gas removal ports is maintained when the supply of the pressurized gas to the immersion fluid barrier is stopped.

12. The containment system of claim 1, wherein the immersion fluid barrier encircles the immersion area.

13. An exposure apparatus for transferring an image onto an object, the exposure apparatus comprising:
   a projection system;
   a stage for holding the object, the projection system forms the image on the object held by the stage;
   an immersion fluid supply system that supplies an immersion fluid to an immersion area to fill a gap between the projection system and the object held by the stage with the immersion fluid; and
   the containment system of claim 1 that forms the immersion fluid barrier adjacent to the immersion area on the object.

14. A process for manufacturing a device comprising the steps of providing an object and transferring an image onto the object utilizing the exposure apparatus of claim 13.

15. A containment system that contains an immersion fluid in an immersion area to fill a gap between a projection system and an object to be exposed with the immersion fluid, the containment system comprising:
   a plurality of gas-supply ports located adjacent to the immersion area, the plurality of gas-supply ports positioned so as to form an immersion fluid barrier that substantially maintains the immersion fluid in the immersion area when a pressurized gas is being supplied from the plurality of gas-supply ports; and
   a gas control system that controls a supply of the pressurized gas to the plurality of gas-supply ports, wherein the gas control system intermittently stops the supply of the pressurized gas to the plurality of gas-supply ports while the immersion fluid in the immersion area contacts the projection system and the object to be exposed.

16. The containment system of claim 15, further comprising a gas source that provides the pressurized gas to the gas control system.

17. The containment system of claim 15, wherein the gas control system temporarily stops the supply of the pressurized gas to the plurality of gas-supply ports at least once during exposure of each shot area on the object.

18. The containment system of claim 17, wherein the gas control system also temporarily stops the supply of the pressurized gas to the plurality of gas-supply ports at least once during movement of the object between shot areas on the object, the gas control system stopping the supply of the pressurized gas to the plurality of gas-supply ports more times between shot areas than during exposure of each of the shot areas.

19. The containment system of claim 15, wherein the gas control system temporarily stops the supply of the pressurized gas to the plurality of gas-supply ports at least once during movement of the object between shot areas on the object.

20. The containment system of claim 15, further comprising an immersion fluid barrier housing that forms part of the immersion fluid barrier and on which the plurality of gas-supply ports are located, and a plurality of projections that extend from a surface of the immersion fluid barrier housing that faces the object to be exposed.

21. The containment system of claim 20, wherein the projections are ribs or arrays of posts.

22. The containment system of claim 15, further comprising gas removal ports that apply a vacuum to the immersion fluid barrier to remove the pressurized gas and immersion fluid that has penetrated into the immersion fluid barrier.

23. The containment system of claim 22, wherein a supply of the vacuum to the gas removal ports is stopped when the gas control system temporarily stops the supply of the pressurized gas to the plurality of gas-supply ports.

24. The containment system of claim 22, wherein a supply of the vacuum to the gas removal ports is maintained when the gas control system temporarily stops the supply of the pressurized gas to the plurality of gas-supply ports.

25. The containment system of claim 15, wherein the immersion fluid barrier encircles the immersion area.

26. An exposure apparatus for transferring an image onto an object, the exposure apparatus comprising:
   a projection system;
   a stage for holding the object, the projection system forms the image on the object held by the stage;
   an immersion fluid supply system that supplies an immersion fluid to an immersion area located in the gap between the projection system and the object held by the stage with the immersion fluid; and
   the containment system of claim 15 that forms the immersion fluid barrier adjacent to the immersion area on the object.

27. A process for manufacturing a device comprising the steps of providing an object and transferring an image onto the object utilizing the exposure apparatus of claim 26.

28. A method of containing an immersion fluid in an immersion area located in a gap between a projection system and an object to be exposed through the immersion fluid, the method comprising:
   forming an immersion fluid barrier with a pressurized gas that is supplied to a location adjacent to the immersion area; and
   intermittently stopping a supply of the pressurized gas to the immersion fluid barrier during an exposure operation of the object.

29. The method of claim 28, wherein a gas control system controls the supply of the pressurized gas to the immersion fluid barrier, and the gas control system intermittently stops the supply of the pressurized gas to the immersion fluid barrier.

30. The method of claim 29, wherein a gas source provides the pressurized gas to the gas control system.

31. The method of claim 28, wherein the supply of the pressurized gas to the immersion fluid barrier is temporarily stopped at least once during exposure of each shot area on the object.

32. The method of claim 31, wherein the supply of the pressurized gas to the immersion fluid barrier also is temporarily stopped at least once during movement of the object between shot areas on the object, the supply of the pressurized gas to the immersion fluid barrier being stopped more times between shot areas than during exposure of each of the shot areas.

33. The method of claim 28, wherein the supply of the pressurized gas to the immersion fluid barrier is temporarily stopped at least once during movement of the object between shot areas on the object.

34. The method of claim 28, wherein the pressurized gas is supplied from an immersion fluid barrier housing that forms part of the immersion fluid barrier, and a plurality of projections extend from a surface of the immersion fluid barrier housing that faces the object to be exposed.

35. The method of claim 34, wherein the projections are ribs or arrays of posts.

36. The method of claim 28, further comprising applying a vacuum to the immersion fluid barrier through gas removal ports to remove the pressurized gas and immersion fluid that has penetrated into the immersion fluid barrier.

37. The method of claim 36, wherein a supply of the vacuum to the gas removal ports is stopped when the supply of the pressurized gas to the immersion fluid barrier is stopped.

38. The method of claim 36, wherein a supply of the vacuum to the gas removal ports is maintained when the supply of the pressurized gas to the immersion fluid barrier is stopped.

39. The method of claim 28, wherein the immersion fluid barrier encircles the immersion area.

40. The method of claim 28, wherein the supply of the pressurized gas to the immersion fluid barrier is intermittently stopped while the immersion fluid is present in the immersion area.

41. The method of claim 28, wherein the pressurized gas is supplied to the immersion fluid barrier by a plurality of gas-supply ports.

42. An exposure method for exposing an object comprising:
    containing an immersion fluid in an immersion area to fill a gap between a projection system and the object;
    forming an immersion fluid barrier with a pressurized gas that is supplied to a location adjacent to the immersion area;
    performing an exposure operation of the object; and
    intermittently stopping a supply of the pressurized gas to the immersion fluid barrier during the exposure operation of the object.

43. A device manufacturing method comprising:
    applying a resist to an object to be exposed;
    exposing the object using the exposure method of claim 42; and
    developing the exposed object.

* * * * *

UNITED STATES PATENT AND TRADEMARK OFFICE
CERTIFICATE OF CORRECTION

PATENT NO.      : 7,580,112 B2
APPLICATION NO. : 11/450381
DATED           : August 25, 2009
INVENTOR(S)     : Michael Sogard Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 518 days.

Signed and Sealed this

Fourteenth Day of September, 2010

David J. Kappos
*Director of the United States Patent and Trademark Office*